US008816789B2

(12) United States Patent
Sako et al.

(10) Patent No.: US 8,816,789 B2
(45) Date of Patent: Aug. 26, 2014

(54) OSCILLATOR AND INPUT-OUTPUT DEVICE AND METHOD OF CONTROLLING THE SAME

(75) Inventors: Kazutoshi Sako, Kanagawa (JP); Tomokazu Matsuzaki, Kanagawa (JP); Kouji Yokosawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 137 days.

(21) Appl. No.: 13/526,026

(22) Filed: Jun. 18, 2012

(65) Prior Publication Data

US 2012/0256691 A1 Oct. 11, 2012

Related U.S. Application Data

(63) Continuation of application No. 12/891,216, filed on Sep. 27, 2010, now Pat. No. 8,217,726.

(30) Foreign Application Priority Data

Sep. 28, 2009 (JP) ................................. 2009-222330

(51) Int. Cl.
*H03B 5/32* (2006.01)
(52) U.S. Cl.
CPC .......... *H03B 5/32* (2013.01); *H03B 2200/0062* (2013.01); *H03B 2200/003* (2013.01); *H03B 2200/006* (2013.01)
USPC ........... 331/158; 331/59; 331/116 R; 713/500
(58) Field of Classification Search
CPC .............. H03B 5/32; H03B 5/36; H03B 5/30; H03B 5/02; H03B 1/00; H03B 2200/003; H03B 2200/006; H03B 2200/0062

USPC ................. 331/59, 116 R, 116 FE, 158, 173; 326/37; 327/141; 713/500
See application file for complete search history.

(56) References Cited

U.S. PATENT DOCUMENTS

| 4,910,703 | A | 3/1990 | Ikeda et al. | |
|---|---|---|---|---|
| 6,157,265 | A * | 12/2000 | Hanjani | 331/49 |
| 6,782,485 | B2 | 8/2004 | Takai | |
| 2004/0075508 | A1 | 4/2004 | Miyahara et al. | |
| 2008/0018515 | A1* | 1/2008 | Rogers et al. | 341/155 |
| 2008/0232009 | A1* | 9/2008 | Ikegami | 361/56 |

FOREIGN PATENT DOCUMENTS

| JP | 4-169983 A | 6/1992 |
|---|---|---|
| JP | 2004-96711 A | 3/2004 |
| JP | 2004-221632 A | 8/2004 |

* cited by examiner

*Primary Examiner* — Ryan Johnson
(74) *Attorney, Agent, or Firm* — Foley & Lardner LLP

(57) ABSTRACT

A semiconductor device according to an exemplary aspect of the invention is capable of being selectively switched between an oscillation circuit and a signal input-output circuit, and includes first and second external connecting terminals that are connectable to an oscillation device; an inverting amplifier an input side of which is electrically connected to the first external connecting terminal through a coupling capacitor and an output side of which is electrically connected to the second external connecting terminal; a feedback resistor connected to the input side and the output side of the inverting amplifier; a bias stabilization circuit that stabilizes a bias applied to the coupling capacitor; a first signal input-output portion connected to the first external connecting terminal; and a second signal input-output portion connected to the second external connecting terminal.

18 Claims, 6 Drawing Sheets

OSCILLATOR AND INPUT-OUTPUT DEVICE AND METHOD OF CONTROLLING THE SAME

CROSS-REFERENCE TO RELATED PATENT APPLICATIONS

Japan Priority Application 2009-222330, filed Sep. 28, 2009 including the specification, drawings, claims and abstract, is incorporated herein by reference in its entirety. This application is a Continuation of U.S. application Ser. No. 12/891,216, filed Sep. 27, 2010, incorporated herein by reference in its entirety.

BACKGROUND OF THE INVENTION

1. Field of the Invention

The present invention relates to a semiconductor device and a method for controlling the same, and more particularly, to a semiconductor device capable of being selectively switched between an oscillation circuit and a signal input-output circuit, and a method for controlling the same.

2. Description of Related Art

Oscillation circuits that generate a clock for a CPU or a timer are roughly classified into a built-in oscillation circuit and a crystal oscillation circuit that requires an external component. The built-in oscillation circuit requires no external component, which read to a reduction in cost. However, in general, the frequency accuracy of the built-in oscillation circuit is low. On the other hand, the crystal oscillation circuit has a high frequency accuracy, though it requires the external component (a crystal oscillation device). For this reason, the crystal oscillation circuit is usually used for a clock generation circuit for a timer. Recently, many of general-purpose ICs such as a microcomputer implement both the built-in oscillation circuit and the crystal oscillation circuit. Thus, those circuits can be selectively used by using software.

A circuit that implements both the built-in oscillation circuit and the crystal oscillation circuit is capable of selectively using those circuits in such a way that a CPU is operated by the high speed built-in oscillation circuit when high performance is needed, and the crystal oscillation circuit is used for an operation (a timer operation) in a standby state, for example. Some microcomputers are used for the timer operation in most of the lifecycle, depending on the environment in which the microcomputers are used. Therefore, a reduction in power consumption of the crystal oscillation circuit is very beneficial for the microcomputers.

Meanwhile, common components have been widely used for the microcomputers to achieve the low cost. In particular, pads for an I/O buffer of the microcomputer need to be shared due to their many functions, because the number of pins and areas are restricted. The crystal oscillation circuit that requires the external crystal oscillation device uses at least two pads. Therefore, it is important to share the pads.

Since the crystal oscillation circuit requires the external component, a leakage current and a parasitic capacitance are generated and cause bias fluctuation, which leads to decreased oscillation stability. To solve these problems, an oscillation circuit disclosed in Japanese Unexamined Patent Application Publication No. 2004-96711 implements a DC-cutting capacitor for cutting a DC bias at an input terminal of the oscillation circuit.

FIG. 6 is a diagram illustrating the oscillation circuit disclosed in Japanese Unexamined Patent Application Publication No. 2004-96711. As shown in FIG. 6, the oscillation circuit disclosed in Japanese Unexamined Patent Application Publication No. 2004-96711 includes a crystal oscillator 110 serving as an oscillating source, and a main circuit portion 120 which is connected to the crystal oscillator 110 through a signal path and which is oscillated and driven. The main circuit portion 120 is formed as a semiconductor device, and both ends of the crystal oscillator 110 are connected to input-output terminals Xin and Xout of the signal path.

The main circuit portion 120 includes an inverter 122 that is connected to the crystal oscillator 110 through the input-output terminals Xin and Xout; a feedback resistor 124; and a DC-cutting capacitor 126 that is an element galvanically, or in a DC manner, isolating the signal path provided between an input side of the inverter 122 and the input terminal Xin of the signal path. Electrostatic protection circuits 140-1 and 140-2 are provided to signal lines on the input-output terminals Xin and Xout sides of the main circuit portion 120, thereby preventing any surge voltage that intrudes from the exterior from intruding into the main circuit portion 120. In this case, Cy1 and Cy2 denote parasitic capacitances of diodes. Cg and Cd denote capacitances on the input terminal side and the output terminal side of the crystal oscillator 110, respectively. In addition, Cx denotes a parasitic capacitance of the DC-cutting capacitor 126.

If the DC-cutting capacitor 126 is provided within the circuit, as in the case of the oscillation circuit disclosed in Japanese Unexamined Patent Application Publication No. 2004-96711, the potential of the input terminal Xin of the crystal oscillator 110 is close to an open state and the input terminal potential is unstable. Any change in the potential of the input terminal Xin of the crystal oscillator 110 changes each depletion layer of the parasitic capacitances Cy1, Cy2, and Cx connected to the input terminal Xin, so that the capacitance also changes. Therefore, if a slight leakage occurs at the input terminal Xin of the crystal oscillator 110 due to an external disturbance such as an increase of humidity or light, and the potential of the input terminal Xin changes, the parasitic capacitances also change accordingly. Since the oscillation frequency of the oscillation circuit also changes as a result of such a change in the parasitic capacitances, a problem occurs in that it becomes difficult to obtain stable oscillation.

To solve the above-mentioned problems, a potential stabilization circuit 150 is provided at the input terminal Xin side of the crystal oscillator 110 in the oscillation circuit disclosed in Japanese Unexamined Patent Application Publication No. 2004-96711. In this case, bias resistors 160 and 162 are used for the potential stabilization circuit 150. The bias resistor 160 is connected between the input terminal Xin side and a constant voltage Vreg side, and the bias resistor 162 is connected between the input terminal Xin side and a reference potential Vss side. This configuration makes it possible to suppress an unstable oscillation even if the leakage occurs at the pad for connecting to the external in the oscillation circuit disclosed in Japanese Unexamined Patent Application Publication No. 2004-96711.

SUMMARY OF THE INVENTION

In the oscillation circuit disclosed in Japanese Unexamined Patent Application Publication No. 2004-96711, a DC bias can be determined by pulling up and down using the bias resistors 160 and 162. When the oscillation circuit disclosed in Japanese Unexamined Patent Application Publication No. 2004-96711 is used for a specific use such as a timer, the input-output terminals (Xin and Xout) of the IC configuring such an oscillation circuit are provided as dedicated terminals.

The present inventors have found problems as described below. When a general-purpose IC such as a microcomputer implements such an oscillation circuit, the input-output terminals (Xin and Xout) of the IC are shared between the input and output of other signals. Since the bias resistors 160 and 162 are provided in the oscillation circuit disclosed in Japanese Unexamined Patent Application Publication No. 2004-96711, the leakage current flows through the bias resistors 160 and 162 when the input-output terminals (Xin and Xout) are shared between the input and output of the crystal oscillator and the input and output of the digital I/O. As a result, the output level fluctuates due to the leakage current in the digital I/O. This causes a problem that malfunction frequency occurs and the power consumption increases.

A first exemplary aspect of the present invention is a semiconductor device capable of being selectively switched between an oscillation circuit and a signal input-output circuit, including: first and second external connecting terminals that are connectable to an oscillation device; an inverting amplifier, an input side of the inverting amplifier being electrically connected to the first external connecting terminal through a coupling capacitor, an output side of the inverting amplifier being electrically connected to the second external connecting terminal; a feedback resistor connected to the input side and the output side of the inverting amplifier; a bias stabilization circuit that stabilizes a bias applied to the coupling capacitor; a first signal input-output portion connected to the first external connecting terminal; and a second signal input-output portion connected to the second external connecting terminal, wherein when the semiconductor device is used as the oscillation circuit, the inverting amplifier and the bias stabilization circuit are brought into an operating state and the first and second signal input-output portions are brought into a non-operating state, and when the semiconductor device is used as the signal input-output circuit, the inverting amplifier and the bias stabilization circuit are brought into the non-operating state and the first and second signal input-output portions are brought into the operating state.

The semiconductor device according to the first exemplary aspect of the present invention is configured to be capable of being selectively switched between the oscillation circuit and the signal input-output circuit. This makes it possible to share the signal input-output portion and reduce the number of input-output terminals. Further, when the semiconductor device is used as the signal input-output circuit, it is possible to prevent signals from flowing into the inverting amplifier or the bias stabilization circuit as a leakage current. This results in suppression of the occurrence of malfunction due to the output level fluctuation and reduction in power consumption.

A second exemplary aspect of the present invention is a method for controlling a semiconductor device capable of being selectively switched between an oscillation circuit and a signal input-output circuit, the semiconductor device including: first and second external connecting terminals that are connectable to an oscillation device; an inverting amplifier, an input side of the inverting amplifier being electrically connected to the first external connecting terminal through a coupling capacitor, an output side of the inverting amplifier being electrically connected to the second external connecting terminal; a feedback resistor connected to the input side and the output side of the inverting amplifier; a bias stabilization circuit that stabilizes a bias applied to the coupling capacitor; a first signal input-output portion connected to the first external connecting terminal; and a second signal input-output portion connected to the second external connecting terminal, and the method including: bringing the inverting amplifier and the bias stabilization circuit into an operating state and bringing the first and second signal input-output portions into a non-operating state when the semiconductor device is used as the oscillation circuit, and bringing the inverting amplifier and the bias stabilization circuit into the non-operating state and bringing the first and second signal input-output portions into the operating state when the semiconductor device is used as the signal input-output circuit.

The method for controlling the semiconductor device according to the second exemplary aspect of the present invention can selectively use the oscillation circuit and the signal input-output circuit. This makes it possible to share the signal input-output portion and reduce the number of input-output terminals. Further, when the semiconductor device is used as the signal input-output circuit, it is possible to prevent signals from flowing into the inverting amplifier or the bias stabilization circuit as a leakage current. This results in suppression of the occurrence of malfunction due to the output level fluctuation and reduction in power consumption.

According to exemplary aspects of the present invention, it is possible to provide a semiconductor device capable of being selectively switched between an oscillation circuit and a signal input-output circuit, and a method for controlling the same.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE PREFERRED EMBODIMENTS

First Exemplary Embodiment

Figure 1:
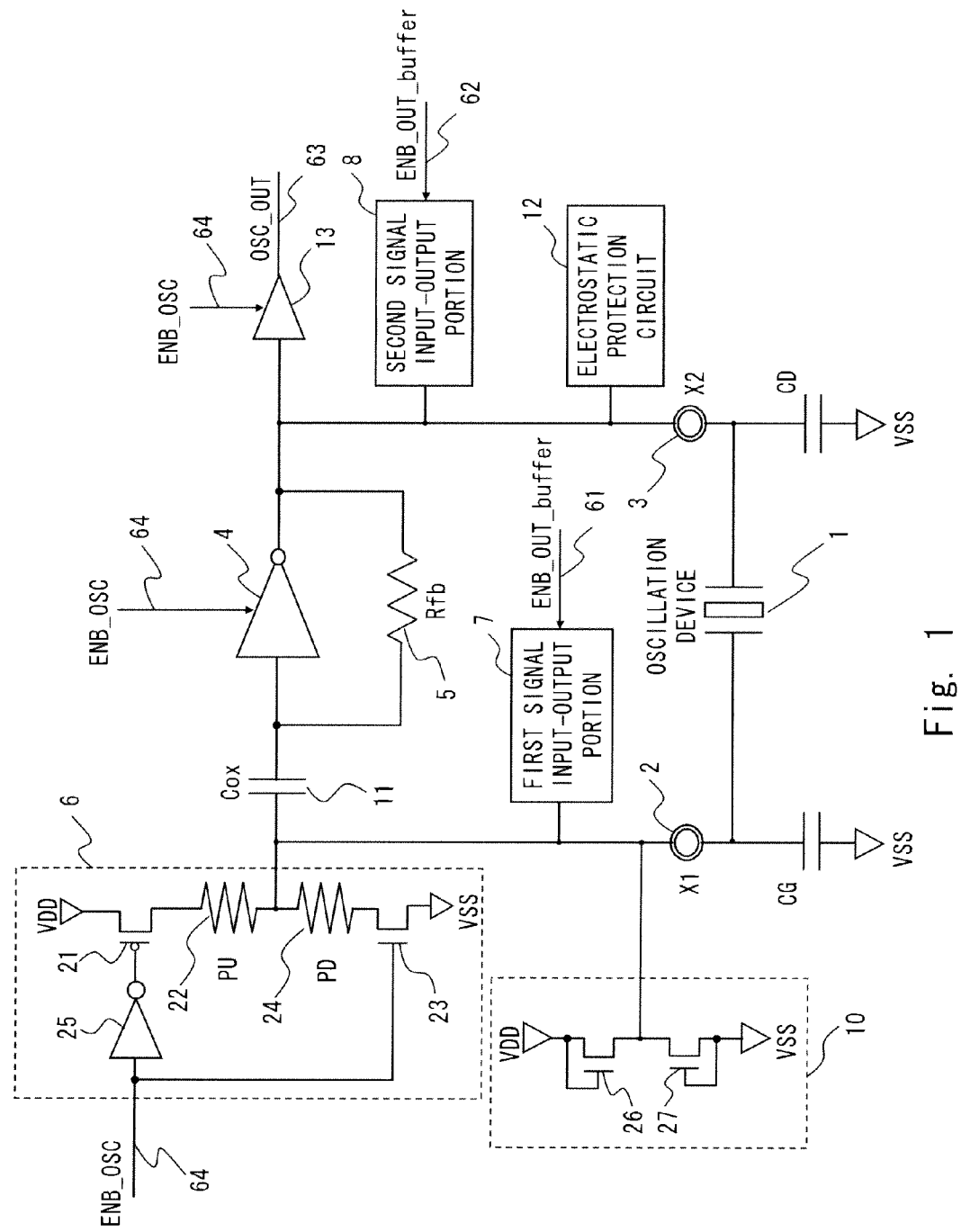
FIG. 1 is a circuit diagram showing a semiconductor device according to a first exemplary embodiment.

A first exemplary embodiment of the present invention will be described below with reference to the accompanying drawings. FIG. 1 is a circuit diagram showing a semiconductor device according to the first exemplary embodiment. As shown in FIG. 1, the semiconductor device according to this exemplary embodiment includes a first external connecting terminal (X1) 2 and a second external connecting terminal (X2) 3 that are connectable to an oscillation device 1; an inverting amplifier 4 an input side of which is electrically connected to the first external connecting terminal (X1) 2 through a coupling capacitor (Cox) 11 and an output side of which is electrically connected to the second external connecting terminal (X2) 3; a feedback resistor (Rfb) 5 connected to the input side and the output side of the inverting amplifier 4; a bias stabilization circuit 6 that stabilizes a bias applied to the coupling capacitor (Cox) 11 connected to the input side of the inverting amplifier 4; a first signal input-output portion 7 that is connected to the first external connecting terminal (X1) 2; and a second signal input-output portion 8 that is connected to the second external connecting terminal (X2) 3.

The semiconductor device according to this exemplary embodiment is capable of being selectively switched between an oscillation circuit and a signal input-output circuit. When the semiconductor device according to this exemplary embodiment is used as the oscillation circuit, the inverting amplifier 4 and the bias stabilization circuit 6 are brought into an operating state and the first and second signal input-output portions 7 and 8 are brought into a non-operating state. When the semiconductor device according to this exemplary embodiment is used as the signal input-output circuit, the inverting amplifier 4 and the bias stabilization circuit 6 are brought into the non-operating state and the first and second signal input-output portions 7 and 8 are brought into the operating state. Hereinafter, the configuration of the semiconductor device according to this exemplary embodiment is described in detail.

When the semiconductor device according to this exemplary embodiment is used as the oscillation circuit, the oscillation device 1 is connected to the first external connecting terminal (X1) 2 and the second external connecting terminal (X2) 3. For example, the oscillation device 1 is a crystal oscillator. Further, the first external connecting terminal (X1) 2 is connected to a power supply terminal (a second power supply terminal) supplied with a ground potential VSS (typically 0 V) through a capacitor CG. The second external connecting terminal (X2) 3 is connected to the power supply terminal (the second power supply terminal) supplied with the ground potential VSS through a capacitor CD.

Further, the first external connecting terminal (X1) 2 is connected to the input side of the inverting amplifier 4 through the coupling capacitor (Cox) 11 that is provided to cut a DC component. The second external connecting terminal (X2) 3 is connected to the output side of the inverting amplifier 4. The feedback resistor (Rfb) 5 is provided between the input side and the output side of the inverting amplifier 4.

For example, when the coupling capacitor (Cox) 11 is configured by a gate capacitor, the coupling capacitor (Cox) 11 depends on the bias because the gate capacitor depends on the bias. In the semiconductor device according to this exemplary embodiment, the bias stabilization circuit 6 that stabilizes the bias applied to the coupling capacitor (Cox) 11 is provided in consideration of the coupling capacitor (Cox) 11 depending on the bias.

For example, the bias stabilization circuit 6 shown in FIG. 1 includes a PMOS transistor (a first transistor) 21, a pull-up resistor PU (a first resistor) 22, a pull-down resistor PD (a second resistor) 24, an NMOS transistor (a second transistor) 23, and an inverter 25. In the PMOS transistor 21, the source is connected to a power supply terminal (a first power supply terminal) supplied with a power supply voltage VDD, the gate is connected to an output side of the inverter 25, and the drain is connected to one end of the pull-up resistor 22.

One end of the pull-up resistor 22 is connected to the drain of the PMOS transistor 21, and the other end of the pull-up resistor 22 is connected to one end of the coupling capacitor (Cox) 11 and one end of the pull-down resistor 24. One end of the pull-down resistor 24 is connected to one end of the coupling capacitor (Cox) 11 and the other end of the pull-up resistor 22, and the other end of the pull-down resistor 24 is connected to the drain of the NMOS transistor 23. In the NMOS transistor 23, the drain is connected to the other end of the pull-down resistor 24, the gate is connected to a node supplied with an ENB_OSC signal 64, and the source is connected to the power supply terminal (the second power supply terminal) supplied with the ground potential VSS. An input side of the inverter 25 is connected to the node supplied with the ENB_OSC signal 64.

The bias applied to the coupling capacitor (Cox) 11 can be determined by the resistance ratio between the pull-up resistor 22 and the pull-down resister 24. That is, the output voltage from the bias stabilization circuit 6 is expressed by Rpd/(Rpu+Rpd)×VDD, where Rpu is a resistance value of the pull-up resistor 22 and Rpd is a resistance value of the pull-down resistor 24.

Further, in the semiconductor device according to this exemplary embodiment, the circuit is mounted on the same semiconductor substrate except for the oscillation device 1, for example, and the oscillation device 1 can be externally connected to the first external connecting terminal (X1) 2 and the second external connecting terminal (X2) 3. In such configuration, a leakage current may be generated at the first external connecting terminal (X1) 2 or the second external connecting terminal (X2) 3 due to an increase of humidity or light, or the circuit may be damaged due to a surge voltage. In the semiconductor device according to this exemplary embodiment, an electrostatic protection circuit 10 may be implemented at the first external connecting terminal (X1) 2 to prevent such phenomenon from occurring.

The electrostatic protection circuit 10 includes an NMOS transistor (a third transistor) 26 and an NMOS transistor (a fourth transistor) 27. The gate and drain of the NMOS transistor 26 are connected to the power supply terminal (the first power supply terminal) supplied with the power supply voltage VDD, and the source of the NMOS transistor 26 is connected to the first external connecting terminal (X1) 2. The drain of the NMOS transistor 27 is connected to the first external connecting terminal (X1) 2, and the gate and source of the NMOS transistor 27 are connected to the power supply terminal (the second power supply terminal) supplied with the ground potential VSS.

The first signal input-output portion 7 is connected to the first external connecting terminal (X1) 2. When the semiconductor device according to this exemplary embodiment is used as the signal input-output circuit, a signal supplied from the first external connecting terminal (X1) 2 can be sent to an internal circuit through the first signal input-output portion 7. Further, a signal supplied from the internal circuit can be output from the first external connecting terminal (X1) 2 through the first signal input-output portion 7. Each of the first external connecting terminal (X1) 2 and the first signal input-output portion 7 functions as a digital I/O in the semiconductor device according to this exemplary embodiment.

Further, a buffer 13 may be provided at the output side of the inverting amplifier 4. A signal that has an oscillation frequency generated at the oscillation circuit is output from the buffer 13. Furthermore, any electrostatic protection circuit may be provided at the second external connecting terminal (X2) 3. Any electrostatic protection circuit may be used, as long as the electrostatic protection circuit protects the internal circuit from the leakage current or the surge voltage generated at the second external connecting terminal (X2) 3.

The second signal input-output portion 8 is connected to the second external connecting terminal (X2) 3. When the semiconductor device according to this exemplary embodiment is used as the signal input-output circuit, a signal supplied from the second external connecting terminal (X2) 3 can be sent to the internal circuit through the second signal input-output portion 8. Further, a signal supplied from the internal circuit can be output from the second external connecting terminal (X2) 3 through the second signal input-output portion 8. Each of the second external connecting terminal (X2) 3 and the second signal input-output portion 8 functions as a digital I/O in the semiconductor device according to this exemplary embodiment.

Figure 2:
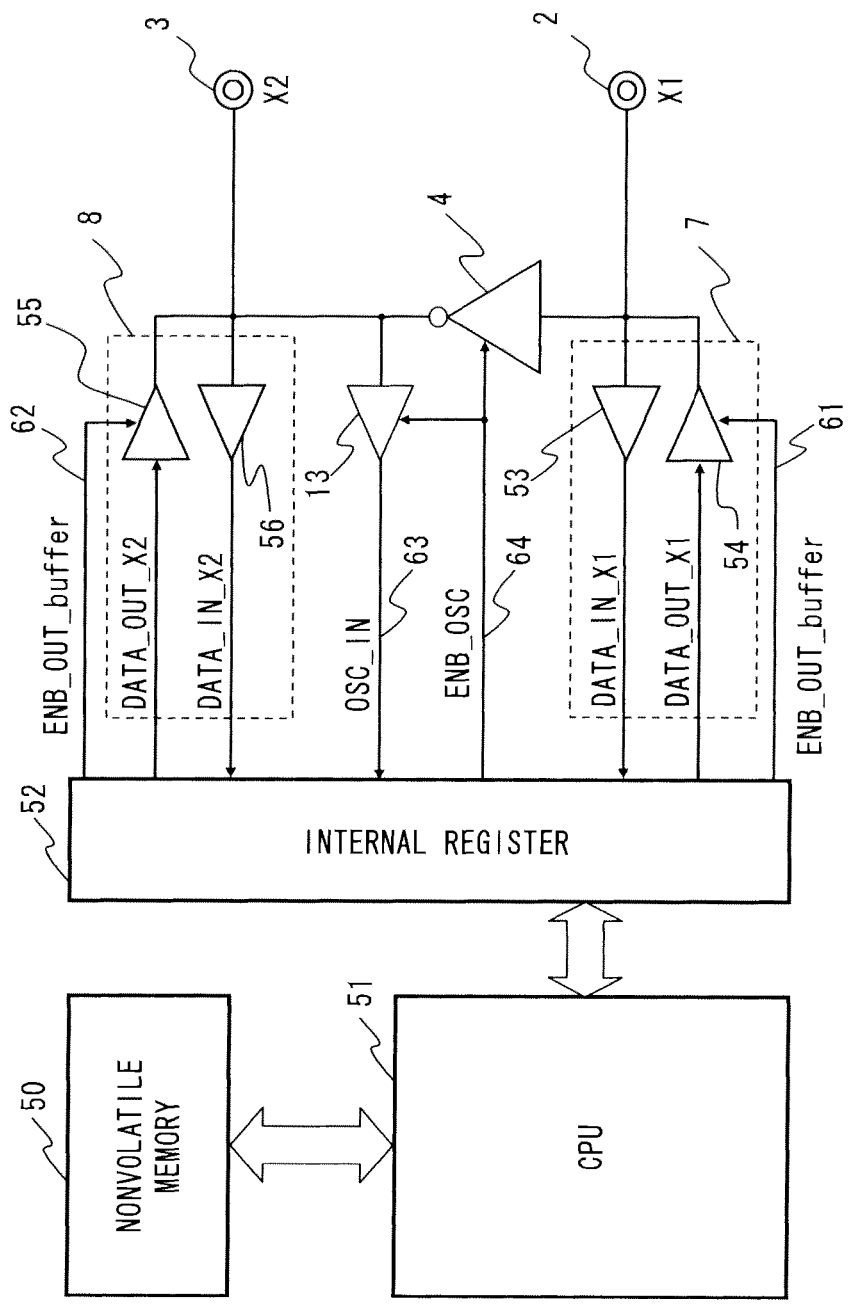
FIG. 2 is a diagram illustrating a unit for controlling the semiconductor device according to the first exemplary embodiment.

Next, a control of the semiconductor device according to this exemplary embodiment will be described. FIG. 2 is a diagram illustrating a unit for controlling the semiconductor device according to this exemplary embodiment. The unit shown in FIG. 2 includes a nonvolatile memory 50, a CPU 51, and an internal register 52. The CPU 51 is connected to the nonvolatile memory 50 and the internal register 52.

The internal register 52 and the first external connecting terminal (X1) 2 are connected to each other through the first signal input-output portion 7. The first signal input-output portion 7 includes buffers 53 and 54. The internal register 52 is supplied with a DATA_IN_X1 signal from the first external connecting terminal (X1) 2 through the buffer 53. The internal register 52 outputs a DATA_OUT_X1 signal to the first external connecting terminal (X1) 2 through the buffer 54. The internal register 52 outputs an ENB_OUT_buffer signal 61 that turns on or off the function of the buffer 54, to the buffer 54.

Similarly, the internal register 52 and the second external connecting terminal (X2) 3 are connected to each other through the second signal input-output portion 8. The second signal input-output portion 8 includes buffers 55 and 56. The internal register 52 is supplied with a DATA_IN_X2 signal from the second external connecting terminal (X2) 3 through the buffer 56. The internal register 52 outputs a DATA_OUT_X2 signal to the second external connecting terminal (X2) 3 through the buffer 55. The internal register 52 outputs an ENB_OUT buffer signal 62 that turns on or off the function of the buffer 55, to the buffer 55.

The internal register 52 outputs an ENB_OSC signal 64 to the inverting amplifier 4 and the buffer 13. The buffer 13 outputs an OSC_IN signal (that corresponds to an OSC_OUT signal 63 shown in FIG. 1) to the internal register 52. The internal register 52 outputs the ENB_OSC signal 64 to the inverter 25 of the bias stabilization circuit 6 shown in FIG. 1. The internal register 52 may control the inverting amplifier 4 or the buffers 13, 54, and 55 to be brought into the operating state or the non-operating state. The nonvolatile memory 50 may store the control information.

Next, operations of the semiconductor device according to this exemplary embodiment are explained with reference to FIGS. 1 and 2. The semiconductor device according to this exemplary embodiment is capable of being selectively switched between the oscillation circuit and the signal input-output circuit. First, the case where the semiconductor device is used as the oscillation circuit is described.

When the semiconductor device is used as the oscillation circuit, the internal register 52 shown in FIG. 2 outputs the ENB_OSC signal 64 to the inverting amplifier 4 and the buffer 13. The ENB_OSC signal 64 brings the inverting amplifier 4 and the buffer 13 into the operating state.

Further, the internal register 52 outputs the ENB_OUT buffer signal 61 to the buffer 54. The ENB_OUT buffer signal 61 brings the buffer 54 of the first signal input-output portion 7 into the non-operating state. This makes it possible to prevent the DATA_OUT_X1 signal from flowing into the input side of the inverting amplifier 4 from the internal register 52. Similarly, the internal register 52 outputs the ENB_OUT_buffer signal 62 to the buffer 55. The ENB_OUT buffer signal 62 brings the buffer 55 of the second signal input-output portion 8 into the non-operating state. This makes it possible to prevent the DATA_OUT_X2 signal from flowing into the output side of the inverting amplifier 4 from the internal register 52. As mentioned above, the semiconductor device according to this exemplary embodiment can prevent unnecessary signals from flowing into the oscillation circuit from the internal register 52 when the semiconductor device is used as the oscillation circuit.

The internal register 52 outputs the ENB_OSC signal 64 to the bias stabilization circuit 6. The ENB_OSC signal 64 brings the bias stabilization circuit 6 into the operating state. For example, the internal register 52 outputs a high level signal as the ENB_OSC signal 64 to the bias stabilization circuit 6 to bring the bias stabilization circuit 6 shown in FIG. 1 into the operating state. When the high level signal is supplied to the gate of the NMOS transistor 23, the pull-down resistor 24 and the power supply terminal (the second power supply terminal) that is supplied with the ground potential VSS are connected. Further, when the high level signal is supplied to the input side of the inverter 25, the inverter 25 outputs a low level signal. Then, the low level signal is supplied to the gate of the PMOS transistor 21, and the pull-up resistor 22 and the power supply terminal (the first power supply terminal) that is supplied with the power supply voltage VDD are connected.

As a result, the power supply terminal (the first power supply terminal) that is supplied with the power supply voltage VDD, the pull-up resistor 22, the pull-down resistor 24, and the power supply terminal (the second power supply terminal) that is supplied with the ground potential VSS are connected in series and function as the bias stabilization circuit 6. An output voltage Rpd/(Rpu+Rpd)×VDD that is determined by the resistance ratio between the pull-up resistor 22 and the pull-down resister 24 is supplied to the coupling capacitor (Cox) 11.

As mentioned above, when the semiconductor device according to this exemplary embodiment is used as the oscillation circuit, the oscillation device 1 is connected to the first external connecting terminal (X1) 2 and the second external connecting terminal (X2) 3 to bring the inverting amplifier 4 and the buffer 13 into the operating state. Further, the bias stabilization circuit 6 supplies the coupling capacitor (Cox) 11, which cuts the DC component, with the output voltage that is determined by the resistance ratio between the pull-up resistor 22 and the pull-down resister 24. As a result, the semiconductor device according to this exemplary embodiment functions as the oscillation circuit, and outputs from the buffer 13 the OSC_OUT signal 63 that is the output signal with a predetermined frequency. The OSC_OUT signal 63 (illustrated as the OSC_IN signal 63 in FIG. 2) output from the buffer 13 is supplied to the internal register 52. In this case, the internal register 52 brings the buffers 54 and 55 into the non-operating state. Therefore, it is possible to prevent the unnecessary signal from flowing into the oscillation circuit from the first signal input-output portion 7 or the second signal input-output portion 8. This results in an improvement in the accuracy of the oscillation circuit.

Figure 5A:
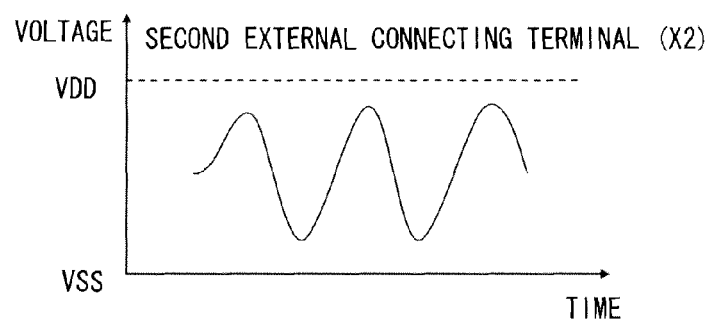
FIGS. 5A to 5D are diagrams illustrating operations of the semiconductor device according to the first to third exemplary embodiments.

FIG. 5A is a diagram illustrating a voltage value at the second external connecting terminal (X2) 3 when the semiconductor device according to this exemplary embodiment is used as the oscillation circuit. As shown in FIG. 5A, the voltage at the second external connecting terminal (X2) 3 oscillates at the predetermined frequency between the power supply voltage VDD and the ground potential VSS. Note that a DC bias at the second external connecting terminal (X2) 3 is determined by a self-bias of the inverting amplifier 4 and the feedback resistor (Rfb) 5.

Figure 5B:
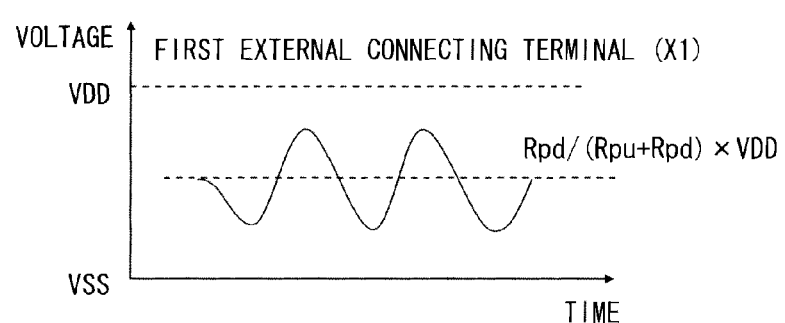

FIG. 5B is a diagram illustrating a voltage value at the first external connecting terminal (X1) 2 when the semiconductor device according to this exemplary embodiment is used as the oscillation circuit. As shown in FIG. 5B, the voltage at the first external connecting terminal (X1) 2 oscillates at the predetermined frequency between the power supply voltage VDD and the ground potential VSS. In this case, the voltage oscillates with the output voltage Rpd/(Rpu+Rpd)×VDD of the bias stabilization circuit 6 as a center.

Next, the case where the semiconductor device is used as the signal input-output circuit is described. When the semiconductor device is used as the signal input-output circuit, the internal register 52 shown in FIG. 2 outputs the ENB_OSC signal 64 to the inverting amplifier 4 and the buffer 13. The ENB_OSC signal 64 brings the inverting amplifier 4 and the buffer 13 into the non-operating state. For example, the inverting amplifier 4 can be configured by a clocked inverter. In this case, the clocked inverter is brought into the non-operating state. Further, the output side of the inverting amplifier 4 is made to be high impedance, for example. This makes it possible to prevent the signal output from the second external connecting terminal (X2) 3 to the second signal input-output portion 8, or the signal output from the second signal input-output portion 8 to the second external connecting terminal (X2) 3, from flowing into the inverting amplifier 4 or the buffer 13. In this case, a resistance value of the feedback resistor (Rfb) 5 that is connected to the output side and the input side of the inverting amplifier 4 is so high that it is possible to prevent these signals from flowing into the inverting amplifier 4 or the buffer 13 through the feedback resistor (Rfb) 5. For example, the resistance value of the feedback resistor (Rfb) 5 is in a range of about 10 MΩ to 20 MΩ.

Further, the internal register 52 outputs the ENB_OUT buffer signal 61 to the buffer 54. The ENB_OUT buffer signal 61 brings the buffer 54 of the first signal input-output portion 7 into the operating state. Similarly, the internal register 52 outputs the ENB_OUT buffer signal 62 to the buffer 55. The ENB_OUT buffer signal 62 brings the buffer 55 of the second signal input-output portion 8 into the operating state. This makes it possible to output the DATA_OUT_X1 signal from the internal register 52 to the first external connecting terminal (X1) 2 through the buffer 54. Further, it is possible to output the DATA_OUT_X2 signal from the internal register 52 to the second external connecting terminal (X2) 3 through the buffer 55.

The internal register 52 outputs the ENB_OSC signal 64 to the bias stabilization circuit 6. The ENB_OSC signal 64 brings the bias stabilization circuit 6 into the non-operating state. For example, the internal register 52 outputs a low level signal as the ENB_OSC signal 64 to the bias stabilization circuit 6 to bring the bias stabilization circuit 6 shown in FIG. 1 into the non-operating state. When the low level signal is supplied to the gate of the NMOS transistor 23, the pull-down resistor 24 and the power supply terminal (the second power supply terminal) that is supplied with the ground potential VSS are disconnected. Further, when the low level signal is supplied to the input side of the inverter 25, the inverter 25 outputs a high level signal. Then, the high level signal is supplied to the gate of the PMOS transistor 21, and the pull-up resistor 22 and the power supply terminal (the first power supply terminal) that is supplied with the power supply voltage VDD are disconnected. This configuration makes it possible to prevent the signal output from the first external connecting terminal (X1) 2 to the first signal input-output portion 7, or the signal output from the first signal input-output portion 7 to the first external connecting terminal (X1) 2, from flowing into the bias stabilization circuit 6.

When the semiconductor device according to this exemplary embodiment is used as the signal input-output circuit, a charging current and a discharging current of the coupling capacitor (Cox) 11 increase. However, a capacitance value of the coupling capacitor (Cox) 11, for example, is about 3 pF, which is nearly equal to a parasitic capacitance. Therefore, the influence thereof is small.

As mentioned above, when the semiconductor device according to this exemplary embodiment is used as the signal input-output circuit, the inverting amplifier 4, the buffer 13, and the bias stabilization circuit 6 are brought into the non-operating state, and the first signal input-output portion 7 and the second signal input-output portion 8 are brought into the operating state. This makes it possible to send the DATA_OUT_X1 signal from the internal register 52 to the first external connecting terminal (X1) 2 and to send the DATA_IN_X1 signal from the first external connecting terminal (X1) 2 to the internal register 52. Similarly, this makes it possible to send the DATA_OUT_X2 signal from the internal register 52 to the second external connecting terminal (X2) 3 and to send the DATA_IN_X2 signal from the second external connecting terminal (X2) 3 to the internal register 52. In this case, it is possible to prevent these signals from flowing into the inverting amplifier 4 or the bias stabilization circuit 6 as a leakage current. This leads to suppression of malfunction due to the output level fluctuation and reduction in power consumption.

Thus, the semiconductor device according to this exemplary embodiment is configured to be capable of being selectively switched between the oscillation circuit and the signal input-output circuit. This makes it possible to share the signal input-output portion and reduce the number of input-output terminals. Further, when the semiconductor device is used as the signal input-output circuit, the semiconductor device according to this exemplary embodiment can prevent signals from flowing into the inverting amplifier or the bias stabilization circuit as a leakage current, thereby suppressing the occurrence of the malfunction due to the output level fluctuation and reducing the power consumption.

Second Exemplary Embodiment

Figure 3:
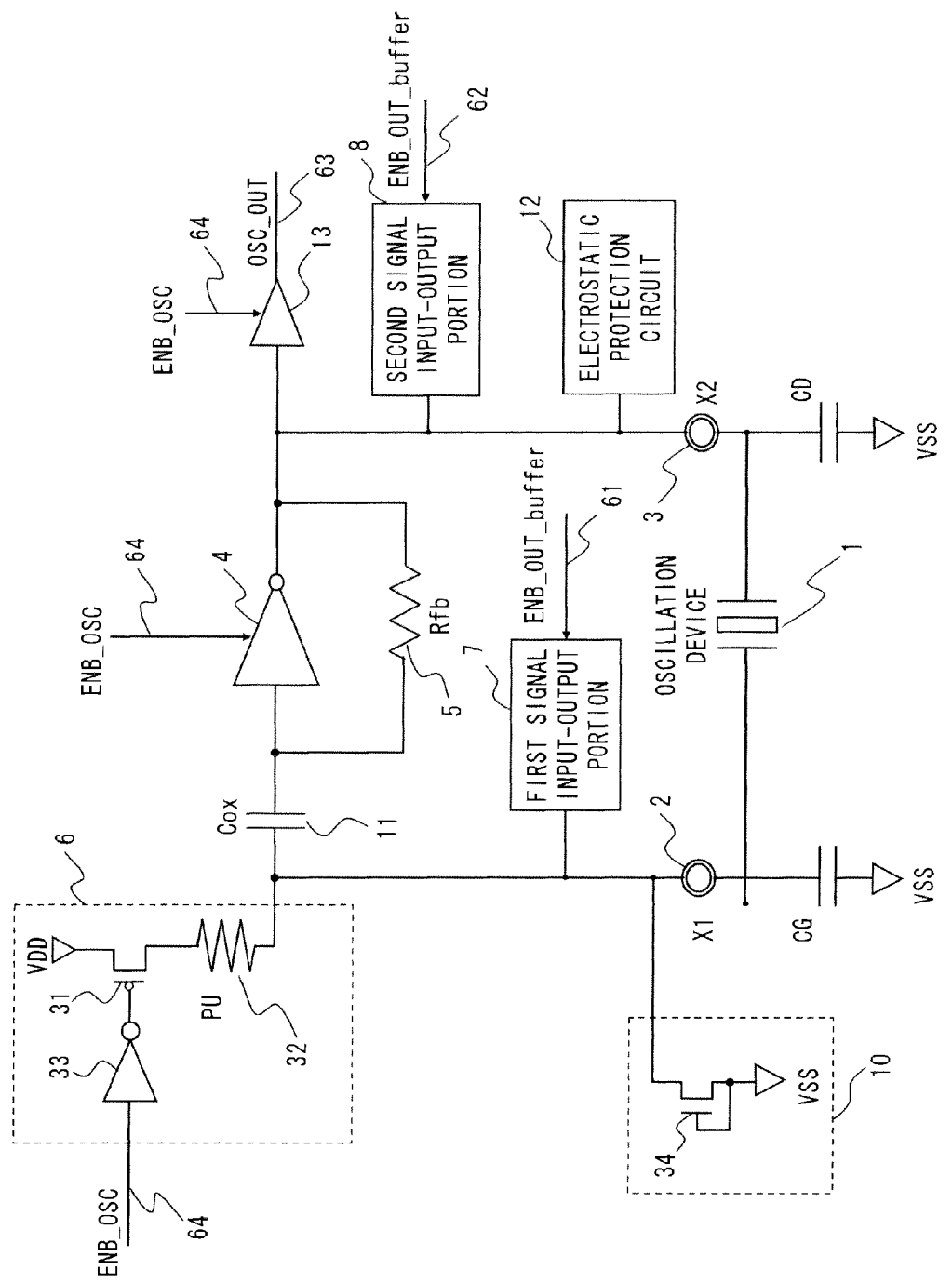
FIG. 3 is a circuit diagram showing a semiconductor device according to a second exemplary embodiment.

Next, a second exemplary embodiment of the present invention will be described. FIG. 3 is a circuit diagram showing a semiconductor device according to the second exemplary embodiment. In the semiconductor device according to this exemplary embodiment, the configurations of the bias stabilization circuit 6 and the electrostatic protection circuit 10 are different from those of the first exemplary embodiment. The other components are similar to those of the first exemplary embodiment, and thus a duplicated description will be omitted.

As shown in FIG. 3, the bias stabilization circuit 6 of the semiconductor device according to this exemplary embodiment includes a PMOS transistor (a fifth transistor) 31, a pull-up resistor (a third resistor) 32, and an inverter 33. In the PMOS transistor 31, the source is connected to the power supply terminal (the first power supply terminal) supplied with the power supply voltage VDD, the gate is connected to an output side of the inverter 33, and the drain is connected to the pull-up resistor 32. The ENB_OSC signal 64 that brings the bias stabilization circuit 6 into an operating state or a non-operating state is supplied to the inverter 33. In this configuration, an output voltage of the bias stabilization circuit 6 is fixed to the power supply voltage VDD and is supplied to the coupling capacitor (Cox) 11.

Figure 5C:
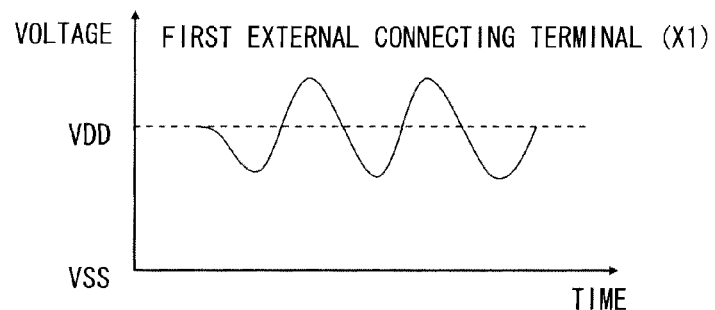

In the semiconductor device according to this exemplary embodiment, the power supply voltage VDD is supplied from the bias stabilization circuit 6 as a bias voltage. Therefore, as shown in FIG. 5C, a voltage at the first external connecting terminal (X1) 2 of the oscillation circuit oscillates with the power supply voltage VDD as a center. In this case, the voltage value of the oscillation circuit exceeds the power supply voltage VDD. When a PMOS transistor is used for the electrostatic protection circuit 10 and the drain of the PMOS transistor and the oscillation circuit are connected to each other, a forward current flows into a parasitic diode between the drain and the back gate. This causes a breakdown or malfunction of the device. Therefore, in the semiconductor device according to this exemplary embodiment, an NMOS transistor (a sixth transistor) 34 is used for the electrostatic protection circuit 10. The drain of the NMOS transistor 34 is connected to the first external connecting terminal (X1) 2, and the gate and source of the NMOS transistor 34 are connected to the power supply terminal (the second power supply terminal) supplied with the ground potential VSS. Further, n-channel open-drain buffers are used as the buffers 54 and 55 (refer to FIG. 2) that are the buffers for the output of the first signal input-output portion 7.

In the semiconductor device according to this exemplary embodiment, the pull-down resistor at the bias stabilization circuit 6 can be omitted. Therefore, the circuit area can be reduced. Further, the input impedance can be increased by reducing the pull-down resistor. This makes it possible to reduce the resistance value of the pull-up resistor compared with that in the first exemplary embodiment. The same advantageous effects described in the first exemplary embodiment can also be achieved in the semiconductor device according to this exemplary embodiment.

Third Exemplary Embodiment

Figure 4:
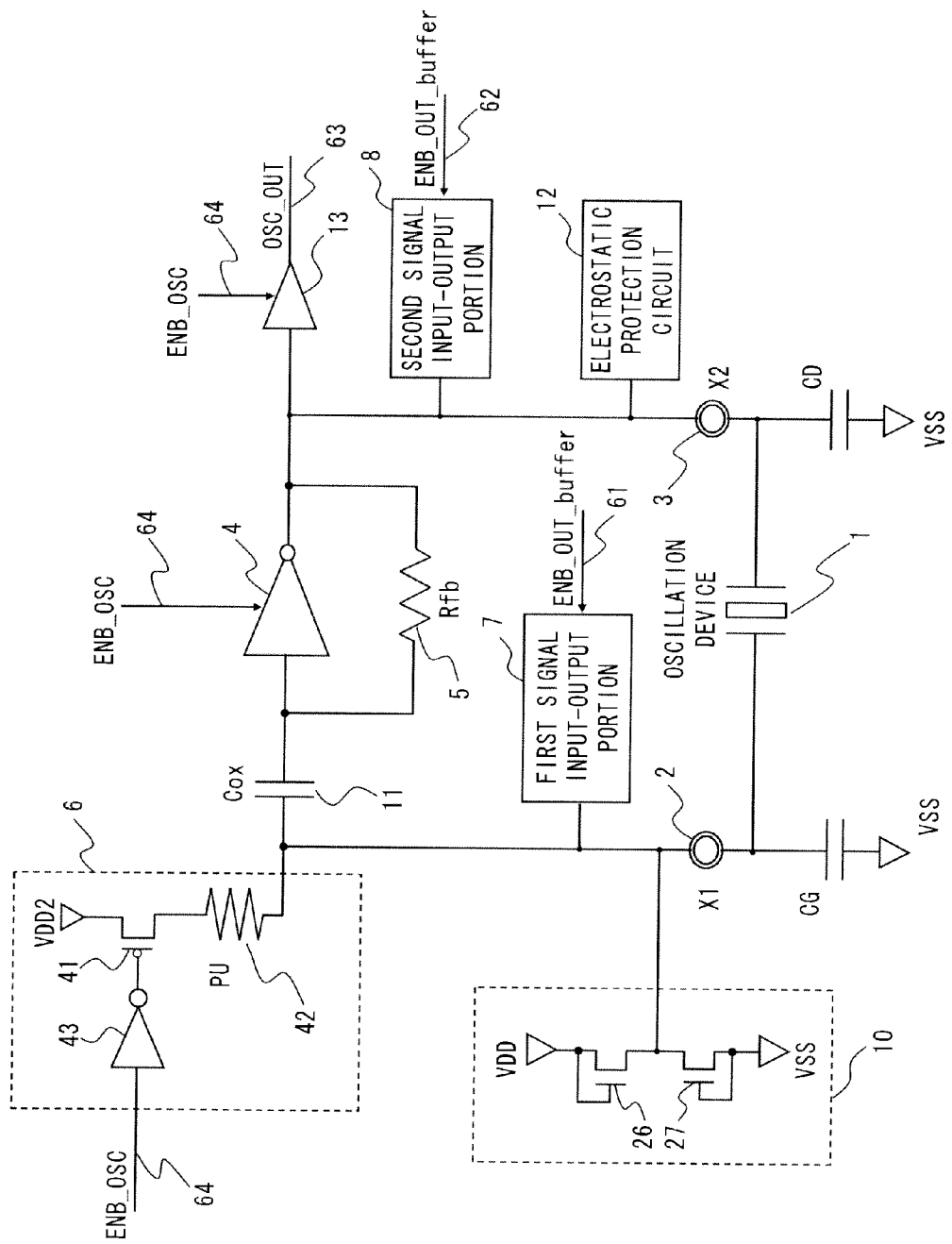
FIG. 4 is a circuit diagram showing a semiconductor device according to a third exemplary embodiment.

Next, a third exemplary embodiment of the present invention will be described. FIG. 4 is a circuit diagram showing a semiconductor device according to the third exemplary embodiment. In the semiconductor device according to this exemplary embodiment, the configuration of the bias stabilization circuit 6 is different from that of the first exemplary embodiment. The other components are similar to those of the first exemplary embodiment, and thus a duplicated description will be omitted.

As shown in FIG. 4, the bias stabilization circuit 6 in the semiconductor device according to this exemplary embodiment includes a PMOS transistor (a seventh transistor) 41, a pull-up resistor (a fourth resistor) 42, and an inverter 43. In the PMOS transistor 41, the source is connected to a power supply terminal (a third power supply terminal) supplied with a power supply voltage VDD2, the gate is connected to an output side of the inverter 43, and the drain is connected to the pull-up resistor 42. The ENB_OSC signal 64 that brings the bias stabilization circuit 6 into an operating state or a non-operating state is supplied to the inverter 43. In this configuration, an output voltage of the bias stabilization circuit 6 is fixed to the power supply voltage VDD2 and is supplied to the coupling capacitor (Cox) 11.

Figure 5D:
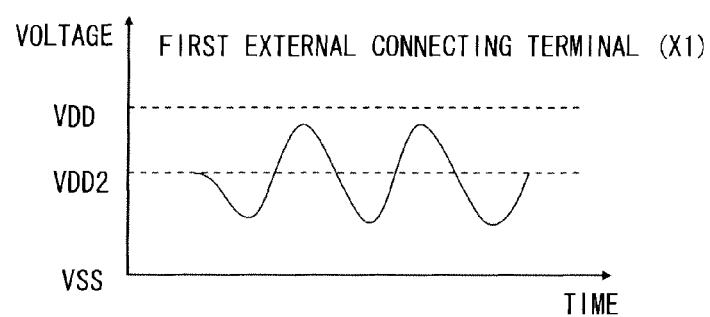
Figure 6:
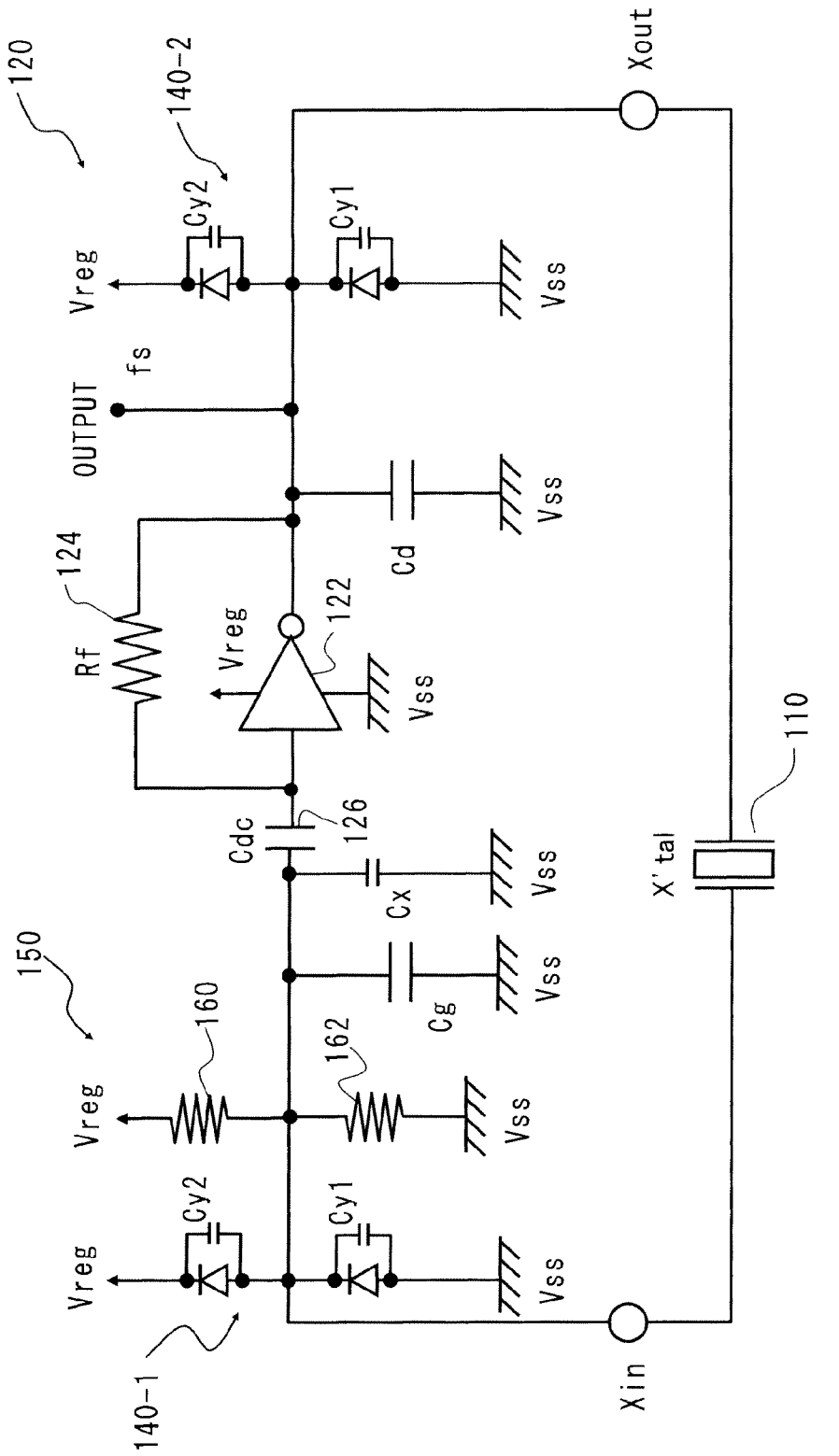
FIG. 6 is a diagram illustrating an oscillation circuit disclosed in Japanese Unexamined Patent Application Publication No. 2004-96711.

In the semiconductor device according to this exemplary embodiment, the power supply voltage VDD2 is supplied from the bias stabilization circuit 6 as a bias voltage. Therefore, as shown in FIG. 5D, a voltage at the first external connecting terminal (X1) 2 of the oscillation circuit oscillates with the power supply voltage VDD2 as a center. In this case, if a value of VDD satisfies VDD≥VDD2+0.5×(a value of amplitude of oscillation), output buffers using CMOS may be used for the buffers 54 and 55 (refer to FIG. 2) that are the buffers for the output of the first signal input-output portion 7. In this case, a system with two power supplies is needed.

However, many of the recent general-purpose ICs have low-voltage power supplies to reduce the power consumption of logic circuits such as a CPU.

In the semiconductor device according to this exemplary embodiment, the pull-down resistor at the bias stabilization circuit 6 can be omitted. Therefore, the circuit area can be reduced. Further, a maximum voltage value at the first external connecting terminal (X1) 2 can be less or equal to the power supply voltage VDD by using the low-voltage power supply VDD2 the voltage value of which is less than that of the power supply voltage VDD. Therefore, the output buffers using CMOS can be used as the buffers 54 and 55 that are the buffers for the output of the first signal input-output portion 7. The same advantageous effects described in the first exemplary embodiment can be also achieved in the semiconductor device according to this exemplary embodiment.

The first to third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

The invention claimed is:

1. A semiconductor device, comprising:
   first and second external terminals that are connectable to an oscillation device;
   an amplifier that includes an input terminal coupled to the first external terminal and an output terminal coupled to the second external terminal;
   a bias stabilization unit that is coupled to the input terminal;
   a signal controller that is coupled to the first external terminal, and that controls a data transfer to and from the first external terminal; and
   a register that is coupled to the bias stabilization unit, and that stores information for controlling an operation of the bias stabilization unit,
   wherein a buffer of the signal controller is controlled as an operating state when the bias stabilization unit is controlled as a non-operation state.

2. The semiconductor device according to claim 1, wherein a switching control between an operating state and a non-operating state of the bias stabilization unit is executed based on the information.

3. The semiconductor device according to claim 1, wherein the bias stabilization unit comprises:
   a first transistor that is coupled between the input terminal and a first reference potential; and
   a second transistor that is coupled between the input terminal and a second reference potential,
   wherein the first and second transistors exclusively operate based on the information.

4. The semiconductor device according to claim 1, further comprising:
   a feedback resistor that is coupled between the input terminal and the output terminal.

5. The semiconductor device according to claim 1, further comprising:
   a capacitor that is coupled between the first external terminal and the input terminal.

6. The semiconductor device according to claim 1,
wherein the signal controller comprises a first signal controller, and
wherein the semiconductor device further comprises:
a second signal controller that is coupled to the second external terminal, and that controls data transfer to and from the second external terminal.

7. The semiconductor device according to claim 1,
wherein the signal controller is coupled to the register, and
wherein the data transfer is controlled based on the information.

8. The semiconductor device according to claim 6,
wherein the first and second signal controllers are coupled to the register, and
wherein the data transfer to and from the first external terminal and the data transfer to and from the second external terminal are controlled based on the information.

9. The semiconductor device according to claim 1,
wherein the amplifier is coupled to the register, and
wherein an operation of the amplifier is controlled based on the information.

10. The semiconductor device according to claim 9,
wherein a switching control between an operating state and a non-operating state of the amplifier is executed based on the information.

11. The semiconductor device according to claim 7,
wherein the signal controller comprises:
an input buffer that is coupled to the first external terminal; and
an output buffer that is coupled to the first external terminal,
wherein the output buffer is controlled as a non-operating state when the bias stabilization unit is controlled as an operation state, and
wherein the output buffer is controlled as an operating state when the bias stabilization unit is controlled as a non-operation state.

12. The semiconductor device according to claim 8,
wherein the first signal controller comprises:
a first input buffer that is coupled to the first external terminal; and
a first output buffer that is coupled to the first external terminal,
wherein the second signal controller comprises:
a second input buffer that is coupled to the second external terminal; and
a second output buffer that is coupled to the second external terminal,
wherein the first and second output buffers are controlled as a non-operating state when the bias stabilization unit is controlled as an operation state, and
wherein the first and second output buffers are controlled as an operating state when the bias stabilization unit is controlled as a non-operation state.

13. The semiconductor device according to claim 9,
wherein the amplifier is controlled as an operating state when the bias stabilization unit is controlled as an operation state, and
wherein the amplifier is controlled as a non-operating state when the bias stabilization unit is controlled as a non-operation state.

14. The semiconductor device according to claim 7,
wherein the amplifier is coupled to the register, and
wherein an operation of the amplifier is controlled based on the information,
wherein the signal controller comprises:
an input buffer that is coupled to the first external terminal; and
an output buffer that is coupled to the first external terminal,
wherein the output buffer is controlled as a non-operating state when the bias stabilization unit and the amplifier are controlled as an operation state, and
wherein the output buffer is controlled as an operating state when the bias stabilization unit and the amplifier are controlled as a non-operation state.

15. The semiconductor device according to claim 8,
wherein the amplifier is coupled to the register,
wherein an operation of the amplifier is controlled based on the information,
wherein the first signal controller comprises:
a first input buffer that is coupled to the first external terminal; and
a first output buffer that is coupled to the first external terminal,
wherein the second signal controller comprises:
a second input buffer that is coupled to the second external terminal; and
a second output buffer that is coupled to the second external terminal,
wherein the first and second output buffers are controlled as a non-operating state when the bias stabilization unit and the amplifier are controlled as an operation state, and
wherein the first and second output buffers are controlled as an operating state when the bias stabilization unit and the amplifier are controlled as a non-operation state.

16. The semiconductor device according to claim 3, further comprising:
an electrostatic protection circuit that is coupled to the first external terminal,
wherein the electrostatic protection circuit comprises:
a third transistor that includes a gate and a drain coupled to the first reference potential and a source coupled to the first external terminal; and
a fourth transistor that includes a gate and a source coupled to the second reference potential and a drain coupled to the first external terminal.

17. The semiconductor device according to claim 1, further comprising:
an electrostatic protection circuit that is coupled to the first external terminal,
wherein the bias stabilization unit comprises:
a first transistor that is coupled between the input terminal and a first reference potential, and that is controlled based on the information, and
wherein the electrostatic protection circuit comprises:
a second transistor that includes a gate and a source coupled to a second reference potential and a drain coupled to the first external terminal.

18. The semiconductor device according to claim 1, further comprising:
an electrostatic protection circuit that is coupled to the first external terminal,
wherein the bias stabilization unit comprises:
a first transistor that is coupled between the input terminal and a first reference potential, and that is controlled based on the information, and
wherein the electrostatic protection circuit comprises:
a second transistor that includes a gate and a drain coupled to a second reference potential and a source coupled to the first external terminal; and a third transistor that includes a gate and a source coupled to a third reference potential and a drain coupled to the first external terminal.

\* \* \* \* \*